(12) United States Patent
Seddon et al.

(10) Patent No.: US 12,154,877 B2
(45) Date of Patent: *Nov. 26, 2024

(54) SEMICONDUCTOR WAFER AND METHOD OF BALL DROP ON THIN WAFER WITH EDGE SUPPORT RING

(71) Applicant: SEMICONDUCTOR COMPONENTS INDUSTRIES, LLC, Phoenix, AZ (US)

(72) Inventors: Michael J. Seddon, Gilbert, AZ (US); Takashi Noma, Ota (JP); Kazuhiro Saito, Ora-gun (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 511 days.

This patent is subject to a terminal disclaimer.

(21) Appl. No.: 17/450,007

(22) Filed: Oct. 5, 2021

(65) Prior Publication Data
US 2022/0028812 A1    Jan. 27, 2022

Related U.S. Application Data

(63) Continuation of application No. 15/871,586, filed on Jan. 15, 2018, now Pat. No. 11,164,835, which is a (Continued)

(51) Int. Cl.
*H01L 23/00*   (2006.01)
*H01L 21/48*   (2006.01)
*B23K 3/06*    (2006.01)

(52) U.S. Cl.
CPC .......... *H01L 24/11* (2013.01); *H01L 21/4853* (2013.01); *H01L 23/562* (2013.01);
(Continued)

(58) Field of Classification Search
CPC ............ H01L 24/06; H01L 2224/0401; H01L 2224/11334; H01L 24/742
See application file for complete search history.

(56) References Cited

U.S. PATENT DOCUMENTS

| 8,523,046 B1 | 9/2013 | Gruber et al. |
| 10,573,803 B1 * | 2/2020 | Hall .................... G01R 31/2853 |

(Continued)

FOREIGN PATENT DOCUMENTS

JP    2000332044 A    11/2000

*Primary Examiner* — Dale E Page
*Assistant Examiner* — Wilner Jean Baptiste
(74) *Attorney, Agent, or Firm* — Adam R. Stephenson, LTD.

(57) ABSTRACT

A semiconductor wafer has an edge support ring around a perimeter of the semiconductor wafer and conductive layer formed over a surface of the semiconductor wafer within the edge support ring. A first stencil is disposed over the edge support ring with first openings aligned with the conductive layer. The first stencil includes a horizontal portion over the edge support ring, and a step-down portion extending the first openings to the conductive layer formed over the surface of the semiconductor wafer. The horizontal portion may have a notch with the edge support ring disposed within the notch. A plurality of bumps is dispersed over the first stencil to occupy the first openings over the conductive layer. A second stencil is disposed over the edge support ring with second openings aligned with the conductive layer to deposit a flux material in the second openings over the conductive layer.

18 Claims, 12 Drawing Sheets

Related U.S. Application Data continuation of application No. 15/240,568, filed on Aug. 18, 2016, now Pat. No. 9,905,525.

(52) U.S. Cl.
CPC .............. *H01L 24/03* (2013.01); *H01L 24/05* (2013.01); *H01L 24/06* (2013.01); *H01L 24/742* (2013.01); *B23K 3/0623* (2013.01); *H01L 24/13* (2013.01); *H01L 24/16* (2013.01); *H01L 24/81* (2013.01); *H01L 24/94* (2013.01); *H01L 2224/0345* (2013.01); *H01L 2224/03452* (2013.01); *H01L 2224/03462* (2013.01); *H01L 2224/03464* (2013.01); *H01L 2224/03828* (2013.01); *H01L 2224/0401* (2013.01); *H01L 2224/05025* (2013.01); *H01L 2224/0557* (2013.01); *H01L 2224/05573* (2013.01); *H01L 2224/0558* (2013.01); *H01L 2224/11002* (2013.01); *H01L 2224/11005* (2013.01); *H01L 2224/1132* (2013.01); *H01L 2224/11334* (2013.01); *H01L 2224/11849* (2013.01); *H01L 2224/13007* (2013.01); *H01L 2224/13026* (2013.01); *H01L 2224/16227* (2013.01); *H01L 2224/81203* (2013.01); *H01L 2224/81815* (2013.01); *H01L 2224/94* (2013.01); *H01L 2924/351* (2013.01)

(56) References Cited

U.S. PATENT DOCUMENTS

| | | | |
|---|---|---|---|
| 11,164,835 B2* | 11/2021 | Seddon | ............... H01L 23/562 |
| 2002/0064933 A1 | 5/2002 | Ueoka | |
| 2007/0123002 A1 | 5/2007 | Norimoto et al. | |
| 2008/0102620 A1 | 5/2008 | Sakaguchi | |
| 2008/0105734 A1 | 5/2008 | Sakaguchi | |
| 2009/0072011 A1 | 3/2009 | Sakaguchi et al. | |
| 2009/0072012 A1 | 3/2009 | Sakaguchi et al. | |
| 2009/0130838 A1 | 5/2009 | Sakaguchi et al. | |
| 2009/0159651 A1 | 6/2009 | Sunohara et al. | |
| 2010/0127049 A1 | 5/2010 | Ishkawa et al. | |
| 2013/0001766 A1 | 1/2013 | Takyu et al. | |
| 2013/0171816 A1 | 7/2013 | Jin | |
| 2014/0103527 A1 | 4/2014 | Marimuthu et al. | |
| 2015/0001278 A1 | 1/2015 | Lee et al. | |
| 2015/0097294 A1 | 4/2015 | Yeduru et al. | |
| 2015/0125999 A1 | 5/2015 | Lee et al. | |

* cited by examiner

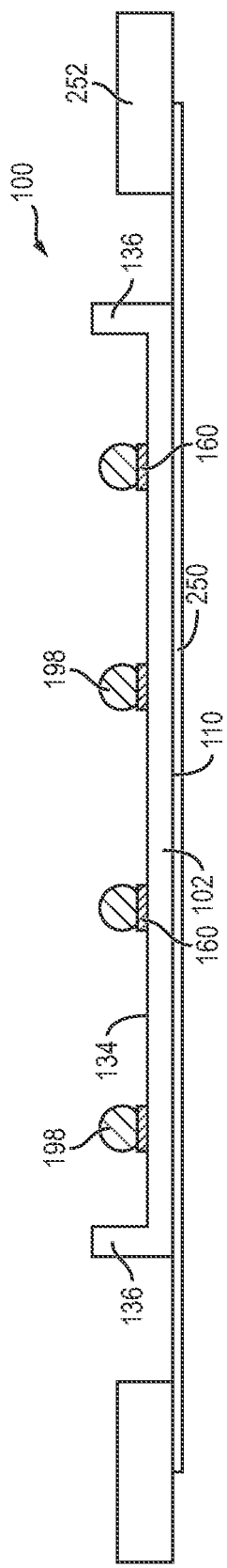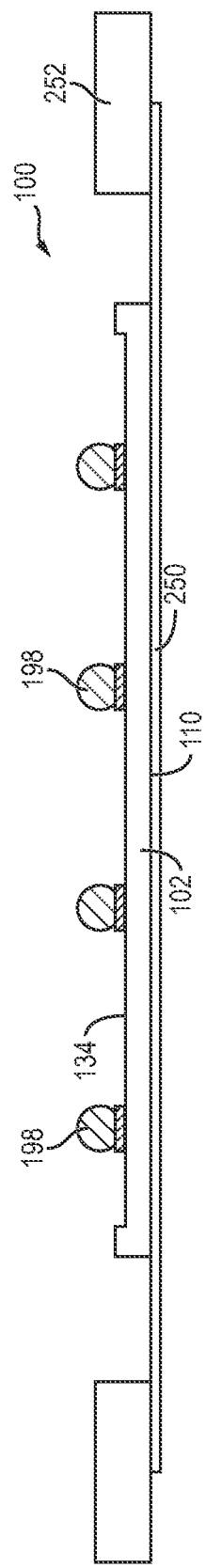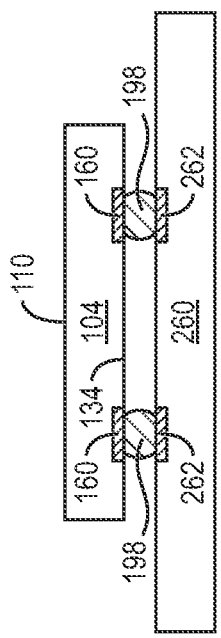

SEMICONDUCTOR WAFER AND METHOD OF BALL DROP ON THIN WAFER WITH EDGE SUPPORT RING

CLAIM TO DOMESTIC PRIORITY

The present application is a continuation of U.S. patent application Ser. No. 15/871,586 to Seddon, filed Jan. 15, 2018, which application is a continuation of U.S. patent application Ser. No. 15/240,568 to Seddon, filed Aug. 18, 2016 and issued as U.S. Pat. No. 9,905,525, the disclosures of each of which are hereby incorporated entirely herein by reference.

FIELD OF THE INVENTION

The present invention relates in general to semiconductor devices and, more particularly, to a semiconductor wafer and method of ball drop on a thin wafer with an edge support ring.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

A semiconductor wafer includes a base substrate material and plurality of semiconductor die formed on an active surface of the wafer separated by a saw street. FIG. 1a shows a conventional semiconductor wafer 10 with base substrate material 12, active surface 14, and back surface 16. Conductive through silicon vias (TSV) 18 are formed through semiconductor wafer 10 and electrically connected to circuits on active surface 14.

Many applications require the semiconductor die to be reduced in height or thickness to minimize the size of the semiconductor package. FIG. 1b shows a grinding operation with grinding wheel 20 removing a portion of back surface 16 of semiconductor wafer 10 and reducing the thickness of the semiconductor wafer to about 100 micrometers (μm). Grinding wheel 20 is controlled to leave edge support ring 22 of base substrate material 12 around a perimeter of semiconductor wafer 10 for structural support. Grinding wheel 20 reduces the thickness of semiconductor wafer 10 in an interior region or wafer grinding area 24 of the wafer within edge support ring 22.

In FIG. 1c, a conductive layer 30 is formed on surface 32 after the grinding operation. Conductive layer 30 includes a plurality of interconnect pads electrically connected to conductive TSV 18 and the circuits on active surface 14. Conductive balls or bumps 34 need to be formed on conductive layer 30 for electrical interconnect. A ball drop process using stencil 36 is a possible technique to distribute bumps 34 onto the interconnect pads of conductive layer 30. Stencil 36 is typically made of metal for stiffness with openings 38 aligned with the interconnect pads of conductive layer 30. Bumps 34 would be deposited over stencil 36 and a brush or shaker causes the bumps to drop into openings 38. Ball drop works if surface 32 is planar and the stencil makes contact with the planar wafer surface. However, if stencil 36 with openings 38 is disposed over edge support ring 22, the separation between openings 38 and the interconnect pads would not achieve the proper placement of bumps 34 on the interconnect pads. Bumps 34 would drop through openings 38 and be randomly dispersed over surface 32. Accordingly, stencil 36 is ineffective in forming bumps 34 over the interconnect pads of conductive layer 30 with edge support ring 22.

A thin semiconductor wafer is susceptible to warpage without support. FIG. 1d shows a warped thin semiconductor wafer 10 without the edge support ring. Stencil 40 is placed over semiconductor wafer 10. The warped condition of semiconductor wafer 10 creates space between openings 42 and surface 44. Surface 44 is not planar in warped semiconductor wafer 10 and portions of stencil 40 do not contact the surface. Bumps 46 would again drop through openings 42 and be randomly dispersed over surface 44. Accordingly, stencil 40 is ineffective in forming bumps 46 over the interconnect pads of conductive layer 30 with a warped semiconductor wafer 10 without an edge support ring.

BRIEF DESCRIPTION OF THE DRAWINGS

FIGS. 11a-11b illustrate preparation of the semiconductor wafer for singulation; and FIG. 12 illustrates the semiconductor die mounted to a PCB.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer may contain active and passive electrical components and optical devices, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The optical device detects and records an image by converting the variable attenuation of light waves or electromagnetic radiation into electric signals.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or interconnect pads for interconnection with other system components. Interconnect pads formed over the semiconductor die are then connected to interconnect pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
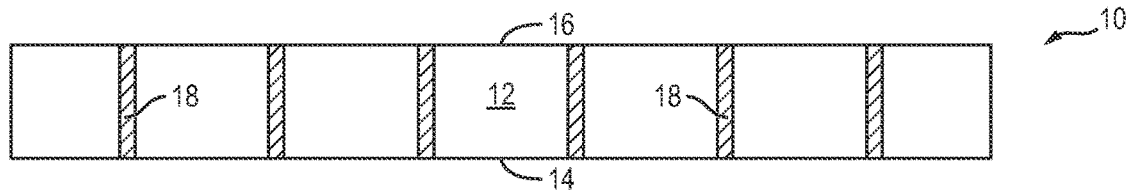
FIGS. 1a-1d illustrate a conventional semiconductor wafer thinning and ball drop process.
Figure 1B:
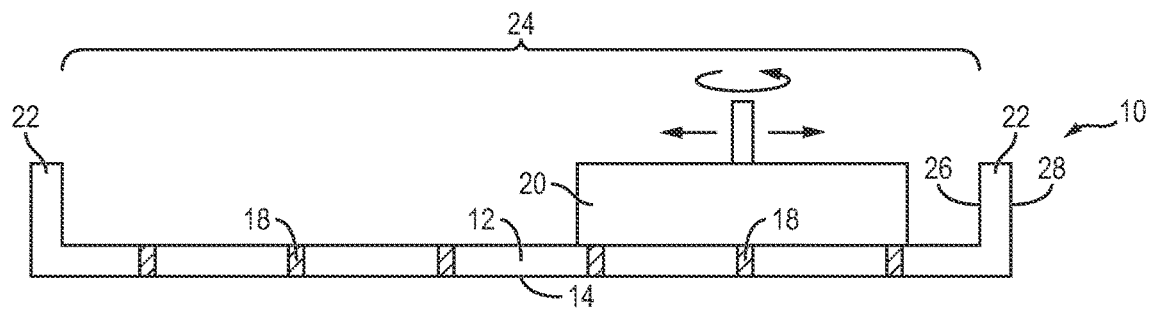
Figure 1C:
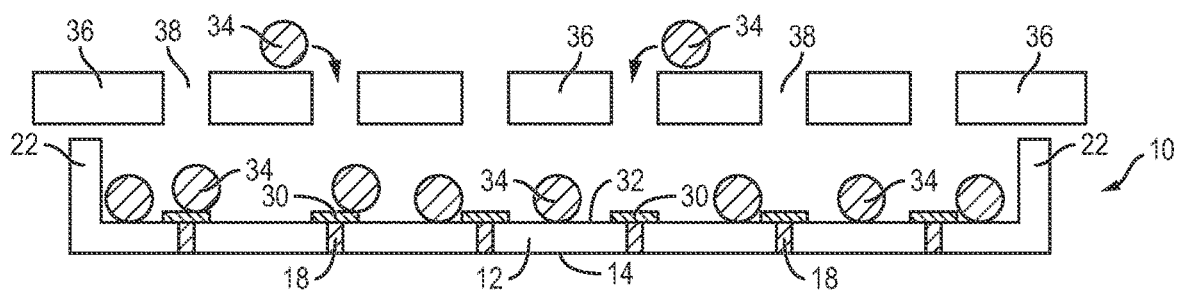
Figure 1D:
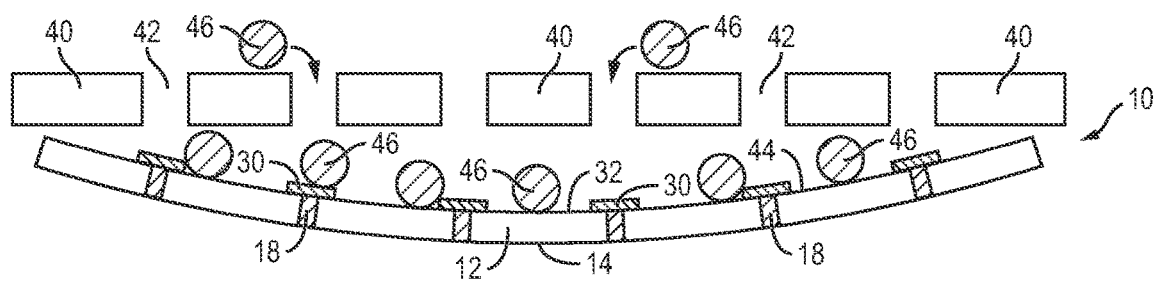
Figure 2A:
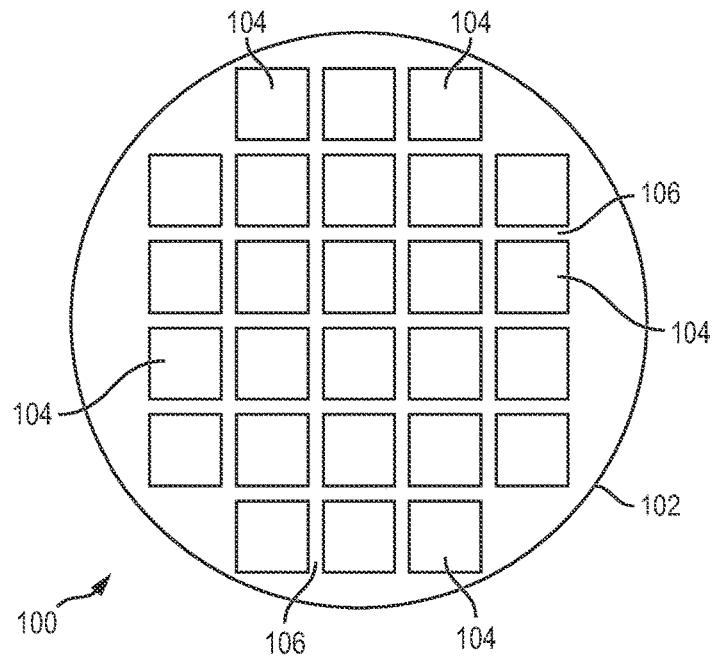
FIGS. 2a-2c illustrate a semiconductor wafer with a plurality of semiconductor die separated by a saw street.

FIG. 2a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by non-active saw street 106, as described above. Saw street 106 provides singulation areas to separate semiconductor wafer 100 into individual semiconductor die 104. In one embodiment, semiconductor wafer 100 has a width or diameter of 100-450 millimeters (mm) and thickness of 675-775 micrometers (μm). In another embodiment, semiconductor wafer 100 has a width or diameter of 150-300 mm.

Figure 2B:
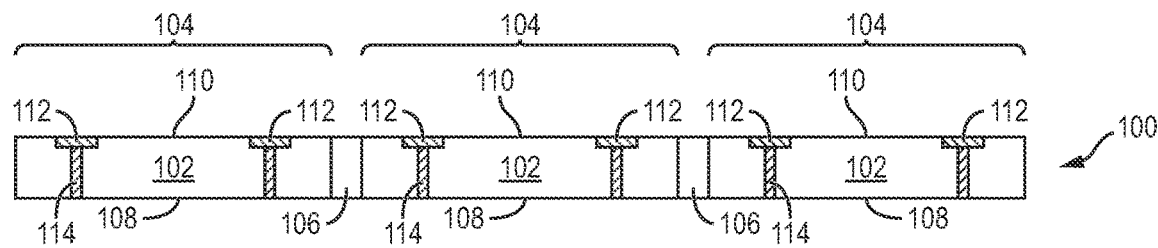

FIG. 2b shows a cross-sectional view of a portion of semiconductor wafer 100. Each semiconductor die 104 has a back surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as digital signal processor (DSP), microcontrollers, ASIC, power conversion, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed over active surface 110 using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), tungsten (W), titanium (Ti), titanium tungsten (TiW), or other suitable electrically conductive material. Conductive layer 112 operates as interconnect pads electrically connected to the circuits on active surface 110.

A plurality of vias is formed through semiconductor wafer 100 using mechanical drilling, laser drilling, or deep reactive ion etching (DRIE). The vias are filled with Al, Cu, Sn, Ni, Au, Ag, W, Ti, TiW, poly-silicon, or other suitable electrically conductive material using electrolytic plating, electroless plating process, or other suitable metal deposition process to form z-direction conductive through silicon vias (TSV) 114 embedded within semiconductor die 104.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical microscope. Semiconductor wafer 100 is inspected for structural characteristics including warpage, thickness variation, surface particulates, irregularities, cracks, delamination, contamination, and discoloration.

Figure 2C:
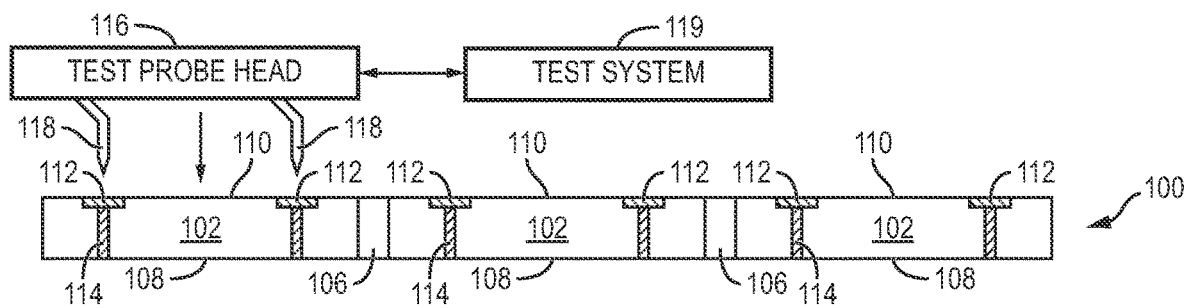

The active and passive components within semiconductor die 104 undergo testing at the wafer level for electrical performance and circuit function. Each semiconductor die 104 is tested for functionality and electrical parameters, as shown in FIG. 2c, using a test probe head 116 including a plurality of probes or test leads 118, or other testing device. Probes 118 are used to make electrical contact with nodes or conductive layer 112 on each semiconductor die 104 and provide electrical stimuli to conductive layer 112. Semiconductor die 104 responds to the electrical stimuli, which is measured by computer test system 119 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

Figure 3A:
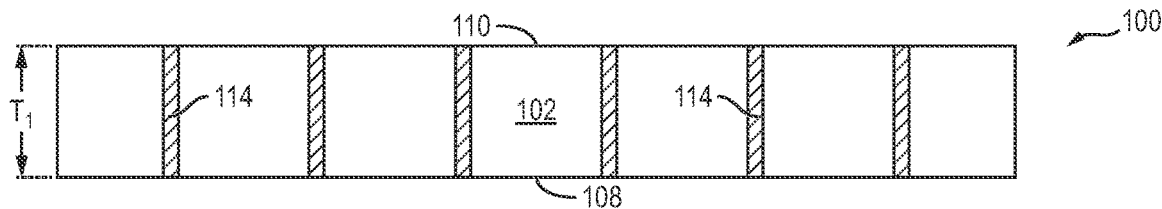
FIGS. 3a-3f illustrate wafer thinning with an edge support ring.

FIGS. 3a-3f illustrate a process of wafer thinning with an edge support ring. FIG. 3a shows an entire area of semiconductor wafer 100 with back surface 108 and active surface 110. Semiconductor die 104 are present in active surface 110, see FIGS. 2a-2c, but not labeled for purposes of the present explanation. Semiconductor wafer 100 has a pre-grinding thickness $T_1$ of 675-775 µm.

Figure 3B:
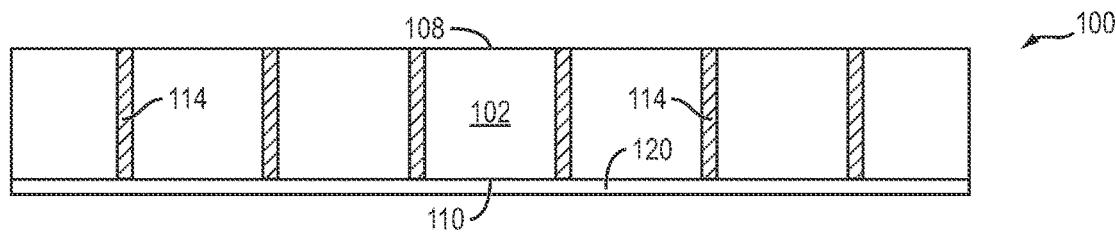
Figure 3C:
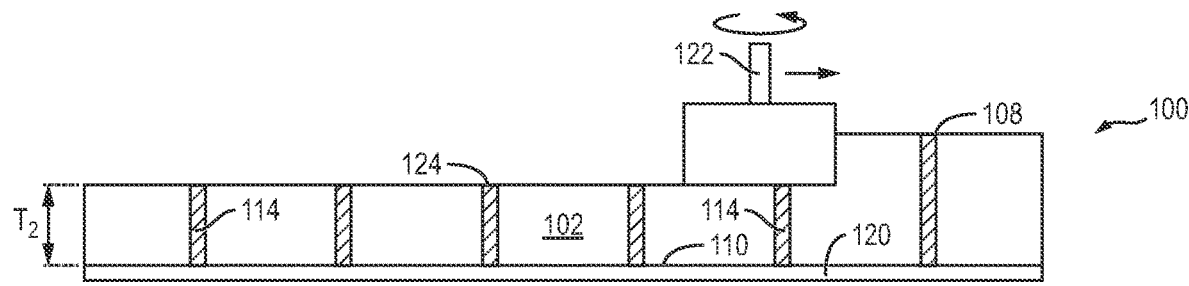

In FIG. 3b, semiconductor wafer 100 is inverted and mounted with active surface 110 oriented to backgrinding tape 120. In FIG. 3c, the entire back surface 108 undergoes a first backgrinding operation with grinder or grinding wheel 122 to remove a portion of base substrate material 102 down to final post-grinding surface 124. Semiconductor wafer 100 has a post-grinding thickness $T_2$ of 355 µm between active surface 110 and surface 124.

Figure 3D:
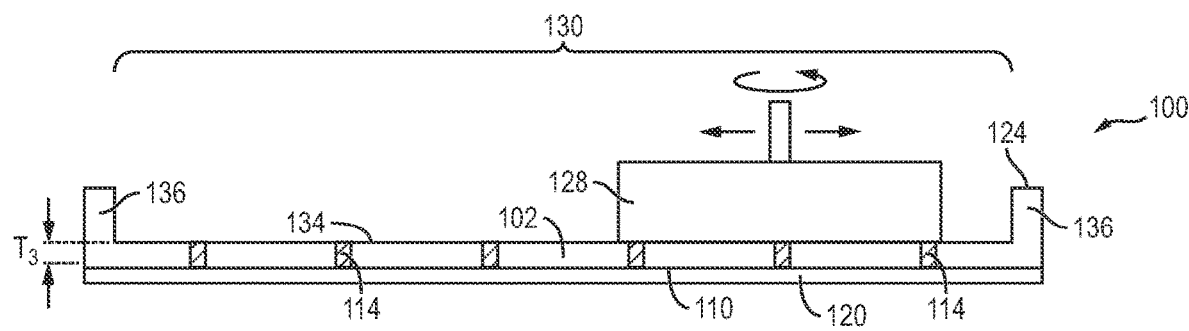

In FIG. 3d, a second grinding operation is applied to surface 124 using grinder or grinding wheel 128. Grinding wheel 128 moves in a cyclic, rotating pattern across an interior region or wafer grinding area 130 of semiconductor wafer 100 to remove a portion of base substrate material 102 down to final post-grinding surface 134. Grinding wheel 128 is controlled to leave edge support ring 136 of base substrate material 102 around a perimeter of semiconductor wafer 100 for structural support. In one embodiment, the post-grinding thickness $T_3$ of semiconductor wafer 100 is 75 µm or less. In another embodiment, the post-grinding thickness $T_3$ of semiconductor wafer 100 is 10-50 µm.

Figure 3E:
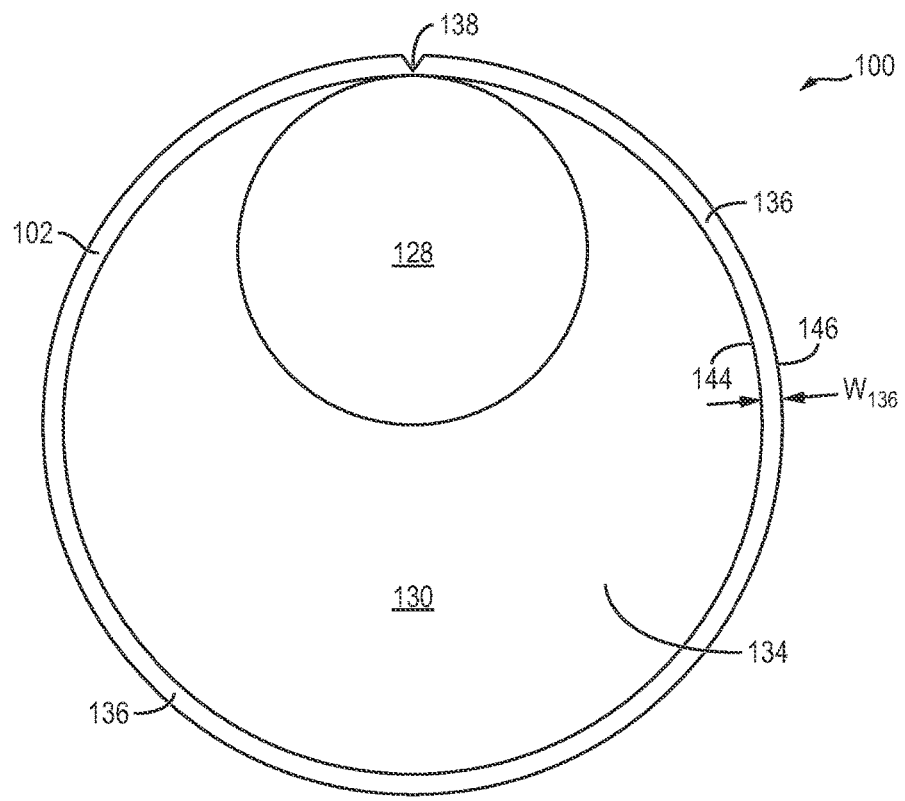

FIG. 3e shows a top view of grinding wheel 128 removing a portion of surface 124 of semiconductor wafer 100 to reduce the thickness of the semiconductor wafer, and correspondingly semiconductor die 104, in grinding area 130, while leaving edge support ring 136 of base substrate material 102 around a perimeter of the semiconductor wafer. Edge support ring 136 has a width $W_{136}$ of 3.0 mm±0.3 mm from inner wall 144 to outer edge 146 around semiconductor wafer 100. The height of edge support ring 136 is the first post-grinding thickness $T_2$ in FIG. 3c, which is greater than the second post-grinding thickness $T_3$ of semiconductor wafer 100 in FIG. 3d, to maintain structural integrity of the thinner semiconductor wafer for wafer handling and manufacturing processes. An orientation notch 138 is provided in an edge of semiconductor wafer 100 to indicate axis of the crystallized structure within base substrate material 102 for various manufacturing processes.

Figure 3F:
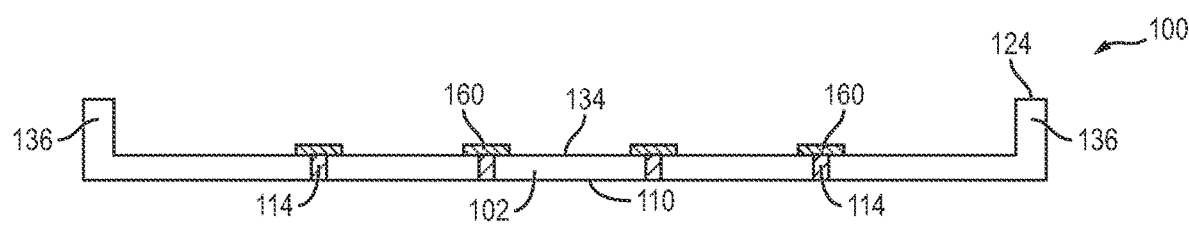

In FIG. 3f, a post-grinding stress relief etch is used to remove or reduce the damage in surface 134 of base substrate material 102 caused by the grinding process. Surface 134 of semiconductor wafer 100 is cleaned with a rinsing solution. An electrically conductive layer 160 is formed over surface 134 using PVD, CVD, electrolytic plating, electroless plating process, evaporation, or other suitable metal deposition process. Conductive layer 160 includes one or more layers of Al, Cu, Sn, Ni, Au, Ag, Ti, TiW, or other suitable electrically conductive material. Conductive layer 160 provides back-side electrical interconnect for semiconductor die 104. In one embodiment, conductive layer 160 includes a plurality of interconnect pads electrically connected to conductive TSV 114. Conductive layer 160 is patterned into electrically common or electrically isolated portions according to the function of semiconductor die 104. Backgrinding tape 120 is removed by exposing the tape to ultraviolet (UV) light and peeling off.

Figure 4A:
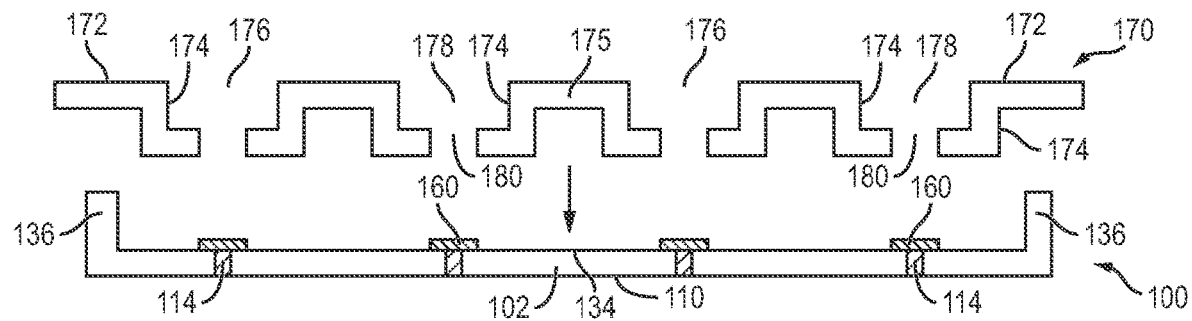
FIGS. 4a-4d illustrate a first embodiment of a stencil to form flux material on a conductive layer within the edge support ring.
Figure 4B:
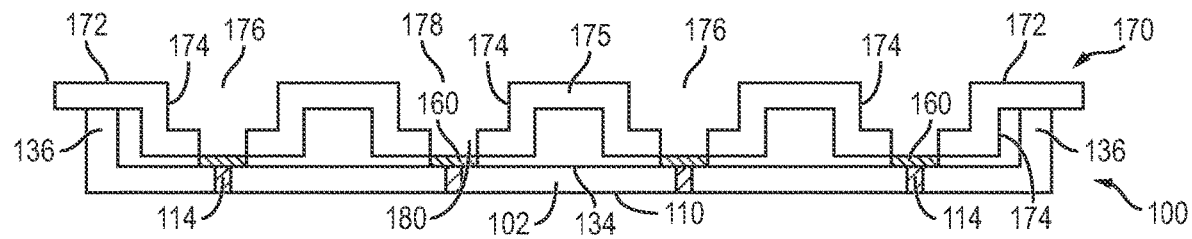
Figure 4C:
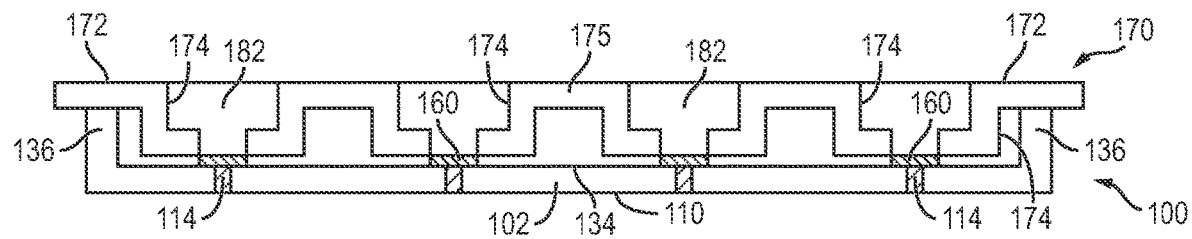
Figure 4D:
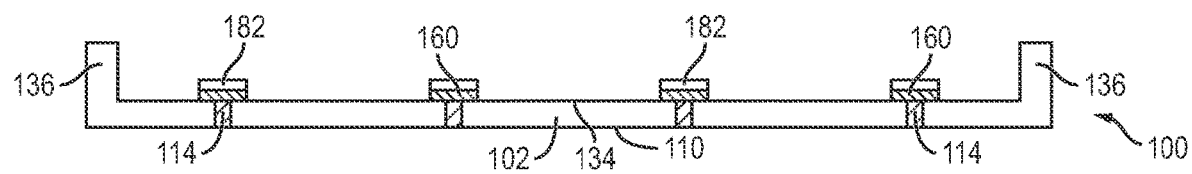

FIGS. 4a-4d illustrate a stencil to form flux material on conductive layer 160 within edge support ring 136. FIG. 4a shows a stencil 170 for screen printing flux material over conductive layer 160 on semiconductor wafer 100 with edge support ring 136. Stencil 170 includes horizontal portion 172, step-down portion 174, horizontal portion 175, and openings 176 with wider portion 178 and narrow portion 180. In FIG. 4b, stencil 170 is disposed over semiconductor wafer 100 with horizontal portion 172 over edge support ring 136. Surface 134 remains substantially planar with edge support ring 136. Step-down portion 174 extends narrow portion 180 of openings 176 inside and below a top surface of edge support ring 136 down to and aligned with the interconnect pads of conductive layer 160 on surface 134. Narrow portion 180 comes in contact with or is immediately adjacent to conductive layer 160. In FIG. 4c, flux material 182 is applied to openings 176 to fill narrow portion 180 and wider portion 178 with a screen printing process. Flux material 182 is deposited on conductive layer 160. In FIG. 4d, stencil 170 is removed leaving flux material 182 in a prescribed amount on conductive layer 160.

Figure 5A:
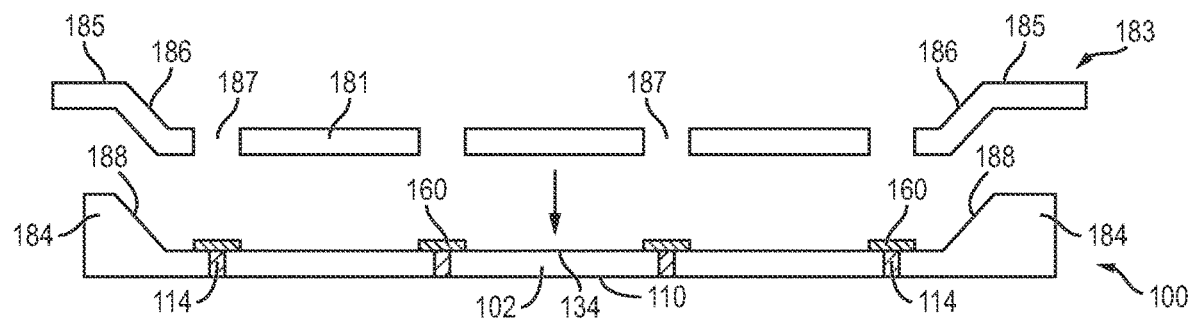
FIGS. 5a-5d illustrate a second embodiment of a stencil to form flux material on the conductive layer within the edge support ring.
Figure 5B:
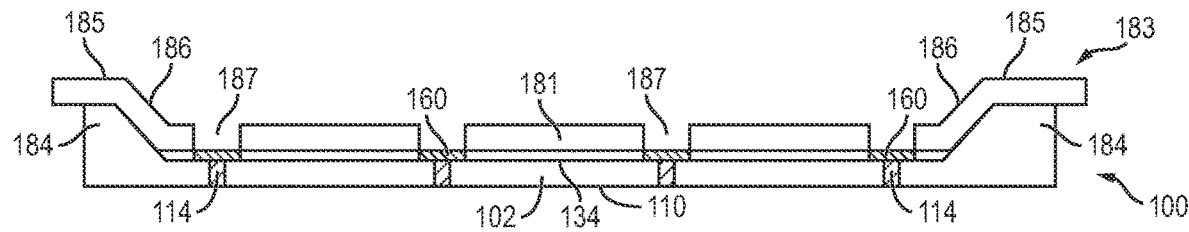
Figure 5C:
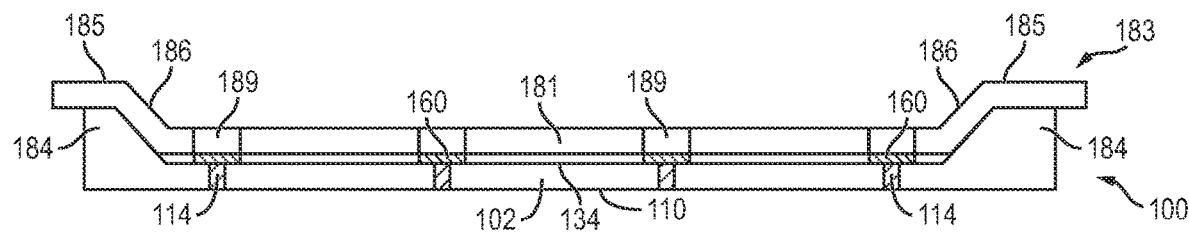
Figure 5D:
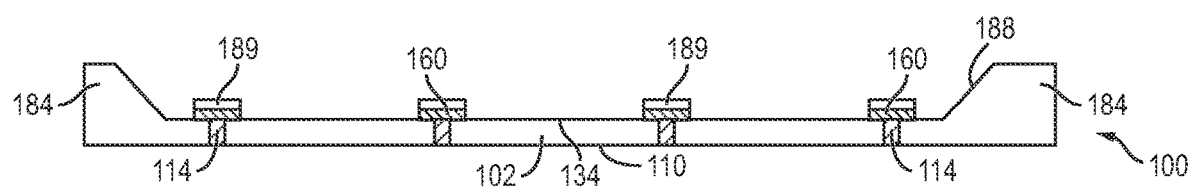

FIGS. 5a-5d illustrate an embodiment of stencil 183 to form flux material on conductive layer 160 within edge support ring 184. In FIG. 5a, stencil 183 includes horizontal portion 185, step-down portion 186, horizontal portion 181, and openings 187. Edge support ring 185 of semiconductor wafer 100 has a sloped surface 188. In FIG. 5b, stencil 183 is disposed over semiconductor wafer 100 with horizontal portion 185 over edge support ring 184. Surface 134 remains substantially planar with edge support ring 184. Step-down portion 186 extends openings 187 inside and below a top surface of edge support ring 184 down to and aligned with the interconnect pads of conductive layer 160 on surface 134. Opening 187 comes in contact with or is immediately adjacent to conductive layer 160. In FIG. 5c, flux material 189 is applied to fill openings 187 with a screen printing process. Flux material 189 is deposited on conductive layer 160. In FIG. 5d, stencil 183 is removed leaving flux material 189 in a prescribed amount on conductive layer 160.

Figure 6A:
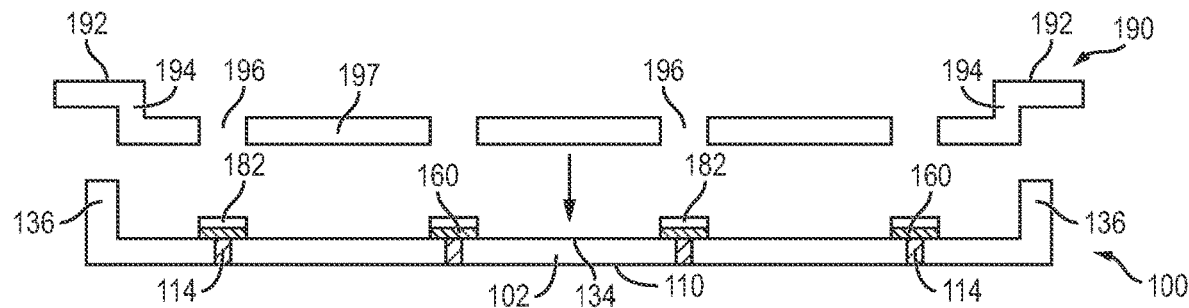
FIGS. 6a-6d illustrate a first embodiment of a stencil to ball drop on the conductive layer within the edge support ring.
Figure 6B:
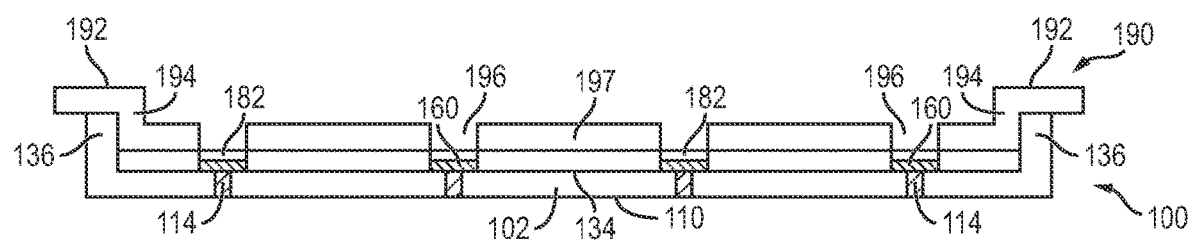
Figure 6C:
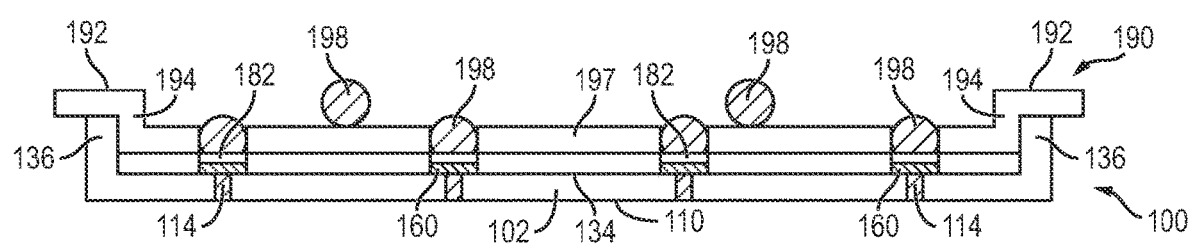
Figure 6D:
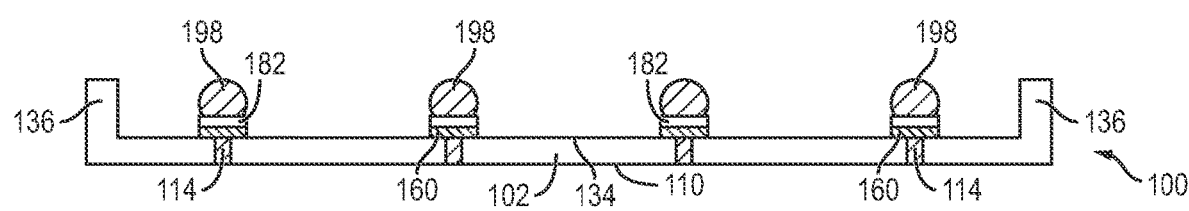

FIGS. 6a-6d illustrate an embodiment of stencil 190 for a ball drop process over conductive layer 160 on surface 134 of semiconductor wafer 100 with edge support ring 136. In FIG. 6a, stencil 190 includes horizontal portion 192, step-down portion 194, horizontal portion 197, and openings 196. In FIG. 6b, stencil 190 is disposed over semiconductor wafer 100 with horizontal portion 192 over edge support ring 136 and openings 196 aligned with the interconnect pads of conductive layer 160. Surface 134 remains substantially planar with edge support ring 136. Step-down portion 194 extends openings 196 inside and below a top surface of edge support ring 136 down to and aligned with the interconnect pads of conductive layer 160 on surface 134. Opening 196 comes in contact with or is immediately adjacent to conductive layer 160. In FIG. 6c, bumps 198 are dispersed on stencil 190 and brushed or shaken to distribute the bumps across the stencil and into openings 196. One bump 198 occupies each opening 196 and contacts flux material 182 on conductive layer 160. Excess bumps 198 are removed by vacuum or brush, or roll off when semiconductor wafer 100 and stencil 190 are tilted. In FIG. 6d, stencil 190 is removed leaving bumps 198 in flux material 182 on conductive layer 160. Flux material 182 keeps bumps 198 in place or minimizes movement of the bumps after removal of stencil 190.

Figure 7A:
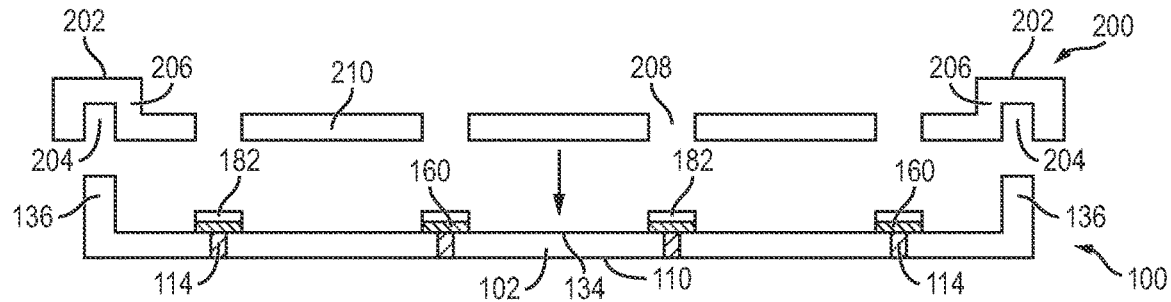
FIGS. 7a-7d illustrate a second embodiment of a stencil to ball drop on the conductive layer within the edge support ring.
Figure 7B:
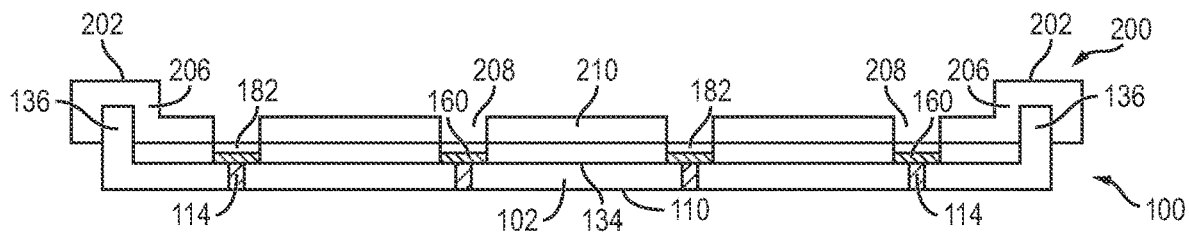
Figure 7C:
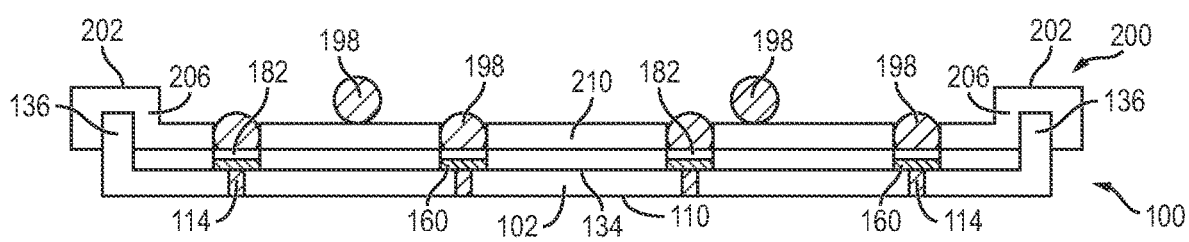
Figure 7D:
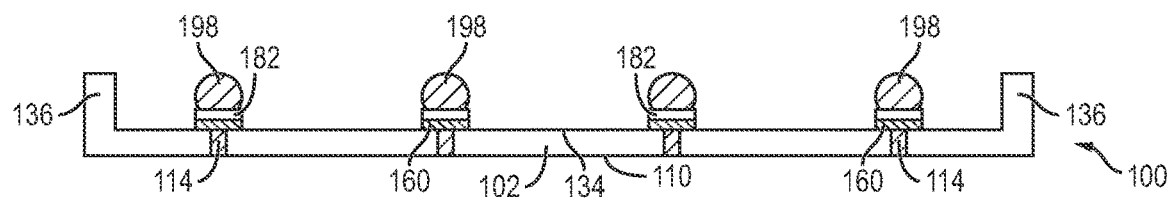

FIGS. 7a-7d illustrate an embodiment of stencil 200 for a ball drop process over conductive layer 160 on surface 134 of semiconductor wafer 100 with edge support ring 136. In FIG. 7a, stencil 200 includes horizontal portion 202 with notch 204, step-down portion 206, horizontal portion 210, and openings 208. In FIG. 7b, stencil 200 is disposed over semiconductor wafer 100 with edge support ring 136 in notch 204 of horizontal portion 202 and openings 208 aligned with the interconnect pads of conductive layer 160. Surface 134 remains substantially planar with edge support ring 136. A portion of edge support ring 136 is disposed within notch 204. Notch 204 and step-down portion 206 extends openings 208 inside and below a top surface of edge support ring 136 down to and aligned with the interconnect pads of conductive layer 160 on surface 134. Opening 208 comes in contact with or is immediately adjacent to conductive layer 160. In FIG. 7c, bumps 198 are dispersed on stencil 200 and brushed or shaken to distribute the bumps across the stencil and into openings 208. One bump 198 occupies each opening 208 and contacts flux material 182 on conductive layer 160. Excess bumps 198 are removed by vacuum or brush, or roll off when semiconductor wafer 100 and stencil 200 are tilted. In FIG. 7d, stencil 200 is removed leaving bumps 198 in flux material 182 on conductive layer 160. Flux material 182 keeps bumps 198 in place or minimizes movement of the bumps after removal of stencil 200.

Figure 8A:
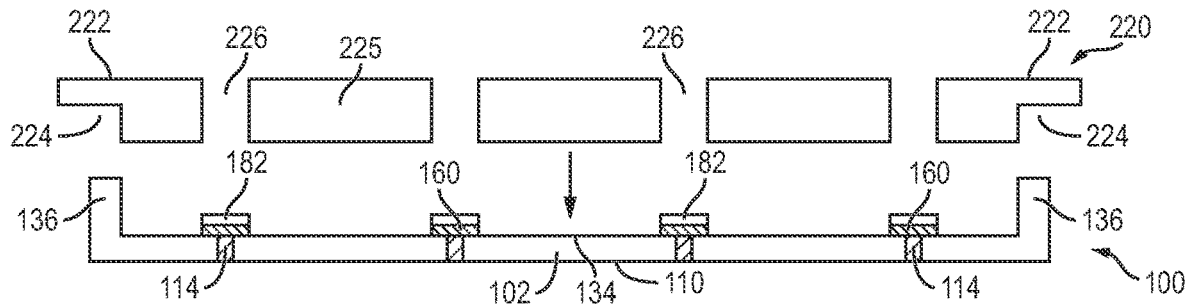
FIGS. 8a-8d illustrate a third embodiment of a stencil to ball drop on the conductive layer within the edge support ring.
Figure 8B:
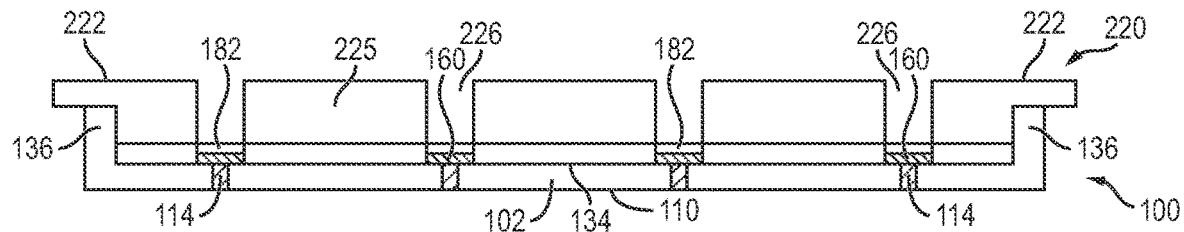
Figure 8C:
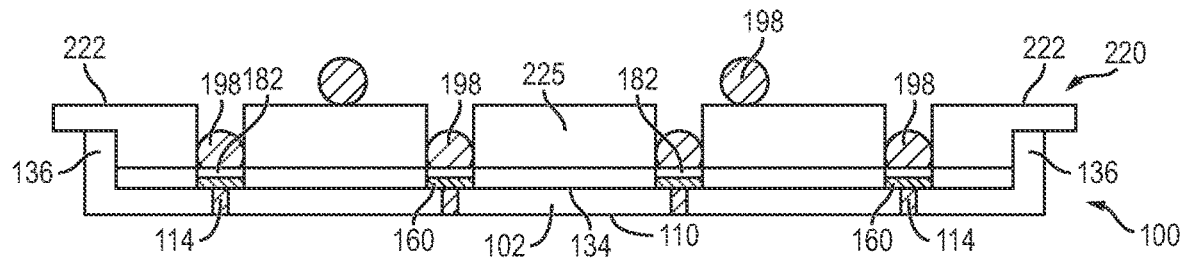
Figure 8D:
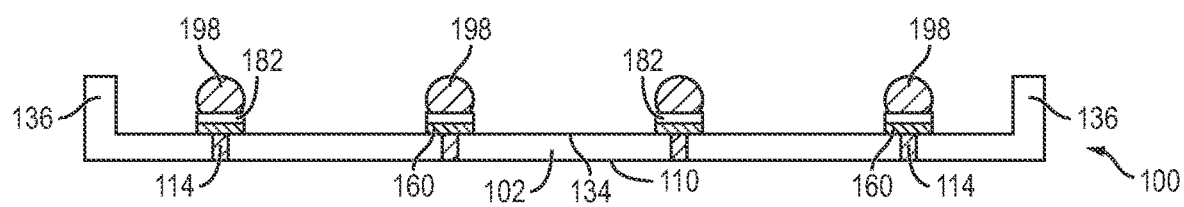

FIGS. 8a-8d illustrate an embodiment of stencil 220 for a ball drop process over conductive layer 160 on surface 134 of semiconductor wafer 100 with edge support ring 136. In FIG. 8a, stencil 220 includes horizontal portion 222 with notch 224, horizontal portion 225, and openings 226. In FIG. 8b, stencil 220 is disposed over semiconductor wafer 100 with edge support ring 136 in notch 224 of horizontal portion 222 and openings 226 aligned with the interconnect pads of conductive layer 160. Surface 134 remains substantially planar with edge support ring 136. A portion of edge support ring 136 is disposed within notch 224 to recess openings 226 inside and below a top surface of the edge support ring down to and aligned with the interconnect pads of conductive layer 160 on surface 134. Opening 226 comes in contact with or is immediately adjacent to conductive layer 160. In FIG. 8c, bumps 198 are dispersed on stencil 220 and brushed or shaken to distribute the bumps across the stencil and into openings 226. One bump 198 occupies each opening 226 and contacts flux material 182 on conductive layer 160. Excess bumps 198 are removed by vacuum or brush, or roll off when semiconductor wafer 100 and stencil 220 are tilted. In FIG. 8d, stencil 220 is removed leaving bumps 198 in flux material 182 on conductive layer 160. Flux material 182 keeps bumps 198 in place or minimizes movement of the bumps after removal of stencil 220.

Figure 9A:
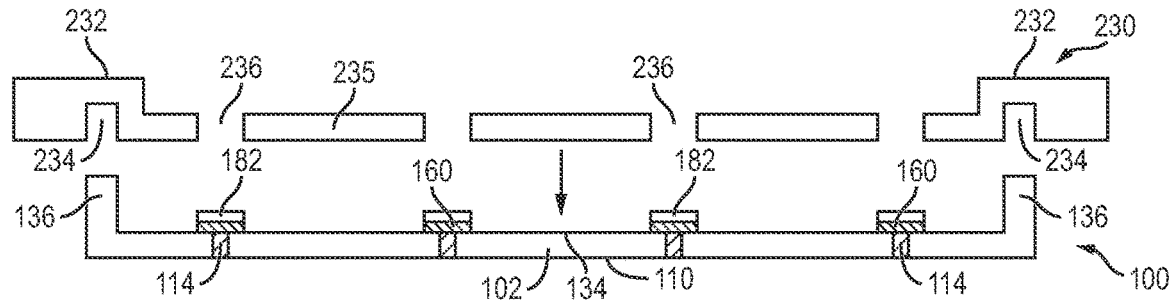
FIGS. 9a-9d illustrate a fourth embodiment of a stencil to ball drop on the conductive layer within the edge support ring.
Figure 9B:
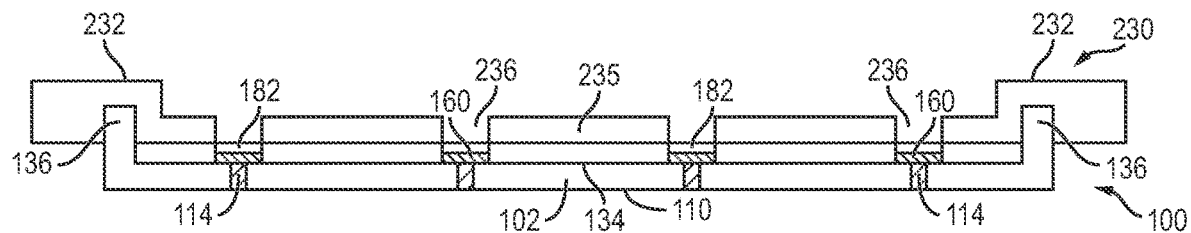
Figure 9C:
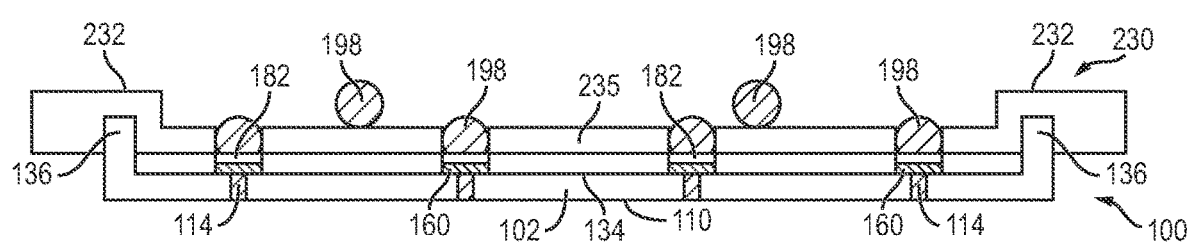
Figure 9D:
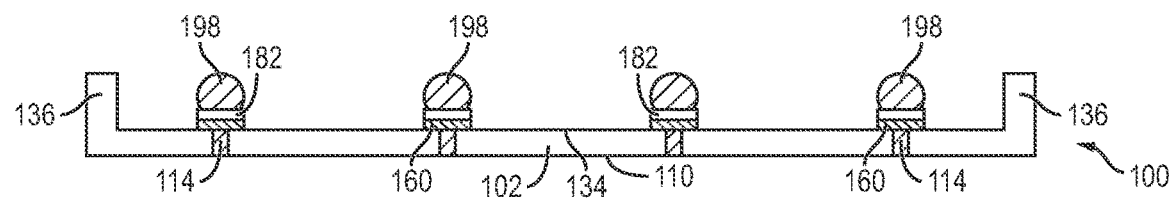

FIGS. 9a-9d illustrate an embodiment of stencil 230 for a ball drop process over conductive layer 160 on surface 134 of semiconductor wafer 100 with edge support ring 136. In FIG. 9a, stencil 230 includes horizontal portion 232 with notch 234, horizontal portion 235, and openings 236. In FIG. 9b, stencil 230 is disposed over semiconductor wafer 100 with edge support ring 136 in notch 234 of horizontal portion 232 and openings 236 aligned with the interconnect pads of conductive layer 160. Surface 134 remains substantially planar with edge support ring 136. A portion of edge support ring 136 is disposed within notch 234 to recess openings 236 inside and below a top surface of the edge support ring down to and aligned with the interconnect pads of conductive layer 160 on surface 134. Opening 236 comes in contact with or is immediately adjacent to conductive layer 160. In FIG. 9c, bumps 198 are dispersed on stencil 230 and brushed or shaken to distribute the bumps across the stencil and into openings 236. One bump 198 occupies each opening 236 and contacts flux material 182 on conductive layer 160. Excess bumps 198 are removed by vacuum or brush, or roll off when semiconductor wafer 100 and stencil 230 are tilted. In FIG. 9d, stencil 230 is removed leaving bumps 198 in flux material 182 on conductive layer 160. Flux material 182 keeps bumps 198 in place or minimizes movement of the bumps after removal of stencil 230.

Figure 10A:
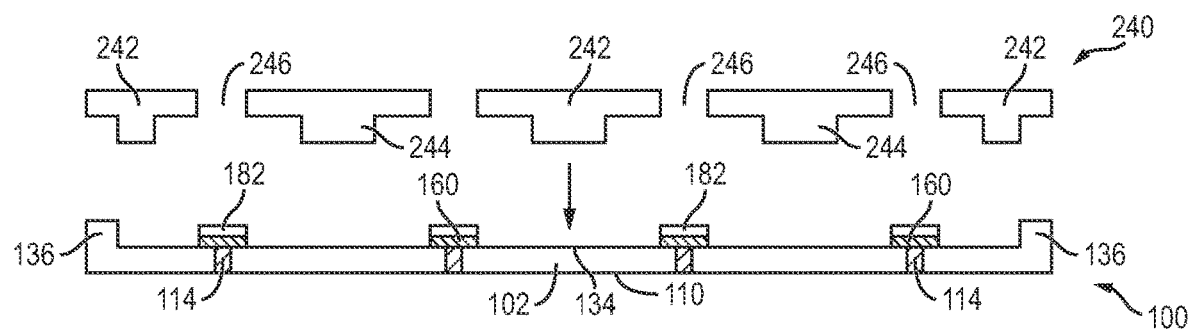
FIGS. 10a-10d illustrate a fifth embodiment of a stencil to ball drop on the conductive layer within the edge support ring.
Figure 10B:
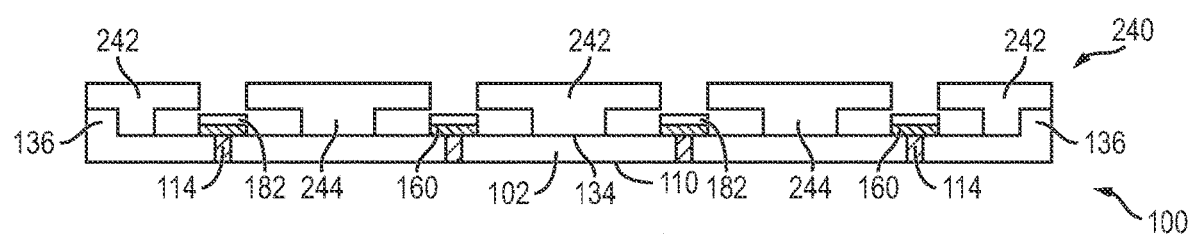
Figure 10C:
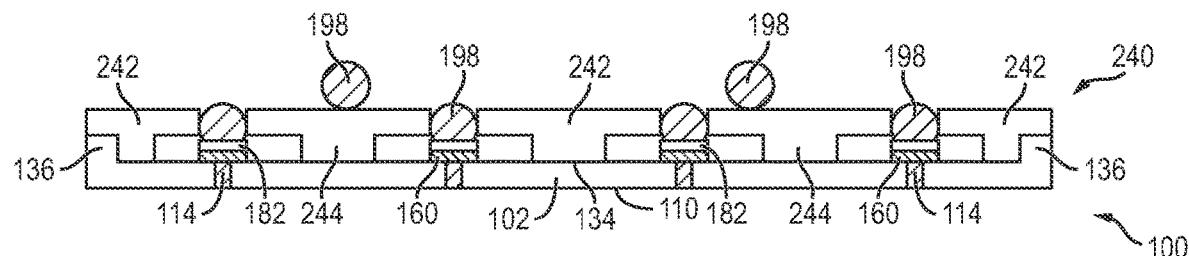
Figure 10D:
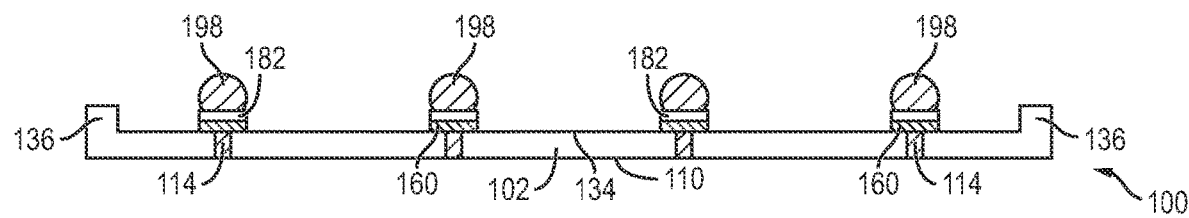

FIGS. 10a-10d illustrate an embodiment of stencil 240 for a ball drop process over conductive layer 160 on surface 134 of semiconductor wafer 100 with edge support ring 136. In FIG. 10a, stencil 240 includes horizontal portion 242 with vertical extensions 244, and openings 246. In FIG. 10b, stencil 240 is disposed over semiconductor wafer 100 with horizontal portion 242 over edge support ring 136 and openings 246 aligned with the interconnect pads of conductive layer 160. Vertical extensions 244 contact surface 134. Surface 134 remains substantially planar with edge support ring 136. In FIG. 10c, bumps 198 are dispersed on stencil 240 and brushed or shaken to distribute the bumps across the stencil and into openings 246. One bump 198 occupies each opening 246 and contacts flux material 182 on conductive layer 160. The proximity of opening 246 in horizontal portion 242 as determined by a height of vertical extensions 244 keep bumps 198 in place over the interconnect pads. Excess bumps 198 are removed by vacuum or brush, or roll off when semiconductor wafer 100 and stencil 240 are tilted. In FIG. 10d, stencil 240 is removed leaving bumps 198 in flux material 182 on conductive layer 160. Flux material 182 keeps bumps 198 in place or minimizes movement of the bumps after removal of stencil 240.

The bump material can be Al, Sn, Ni, Au, Ag, Pb, Bi, Cu, solder, and combinations thereof. For example, the bump material can be eutectic Sn/Pb, high-lead solder, or lead-free solder. Bumps 198 are reflowed by heating the material above its melting point onto the interconnect pads of conductive layer 160. Flux material 182 minimizes movement of bumps 198 until reflow bonds the bumps to conductive layer 160 and removes oxidation from the bumps during reflow. Alternatively, bumps 198 can be thermo-compression bonded to the interconnect pads of conductive layer 160.

In FIG. 11a, semiconductor wafer 100 including bumps 198 is mounted with active surface 110 oriented to tape portion 250 of film frame 252. In FIG. 11b, edge support ring 136 is removed to be planar with or just above (10-13 μm) conductive layer 160 or surface 134. Semiconductor wafer 100 is singulated through saw streets 106 using a saw blade or laser cutting tool or plasma etch into individual semiconductor die 104.

FIG. 12 shows semiconductor die 104 mounted to printed circuit board (PCB) 260 with bumps 198 bonded to conductive layer 262 on the PCB. Bumps 198 provide a large interconnect area with conductive layer 262 and less coefficient of thermal expansion mismatch between the bumps and PCB 260, which reduces thermal stress between the bumps and PCB.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
   providing a semiconductor wafer including an edge support ring around a perimeter of the semiconductor wafer;
   forming a conductive layer over a surface of the semiconductor wafer;
   providing a first stencil including a plurality of first openings; and
   disposing the first stencil over the edge support ring with the plurality of first openings extending below a top surface of the edge support ring to contact the conductive layer.

2. The method of claim 1, further including dispersing a plurality of bumps over the first stencil to occupy the plurality of first openings over the conductive layer.

3. The method of claim 2, further including:
bonding the plurality of bumps to the conductive layer; and
removing the first stencil.

4. The method of claim 1, wherein the first stencil includes a horizontal portion containing the plurality of first openings and a vertical extension disposed over the edge support ring and extending to the horizontal portion of the first stencil.

5. The method of claim 1, further including:
providing a second stencil including a plurality of second openings;
disposing a second stencil over the edge support ring with the plurality of second openings extending to and aligned with the conductive layer; and
depositing a flux material in the plurality of second openings over the conductive layer.

6. The method of claim 1, wherein the first stencil includes a notch disposed over the edge support ring.

7. A method of making a semiconductor device, comprising:
providing a semiconductor wafer including a conductive layer formed over a surface of the semiconductor wafer and an edge support ring around a perimeter of the semiconductor wafer;
providing a first stencil including a plurality of first openings; and
disposing the first stencil over the edge support ring with the plurality of first openings aligned with and extending to a flux material formed over the conductive layer.

8. The method of claim 7, further including dispersing a plurality of bumps over the first stencil to occupy the plurality of first openings over the conductive layer.

9. The method of claim 8, further including:
bonding the plurality of bumps to the flux material; and
removing the first stencil.

10. The method of claim 7, wherein the first stencil includes a horizontal portion containing the plurality of first openings and a vertical extension disposed over the edge support ring and extending to the horizontal portion of the first stencil.

11. The method of claim 7, further including:
providing a second stencil including a plurality of second openings;
disposing a second stencil over the edge support ring with the plurality of second openings extending to and aligned with the conductive layer; and
depositing the flux material in the plurality of second openings over the conductive layer.

12. The method of claim 7, wherein the first stencil includes a notch disposed over the edge support ring.

13. The method of claim 7, wherein the first stencil includes a horizontal portion and a step-down portion extending from a top surface of the edge support ring to the horizontal portion of the first stencil.

14. A semiconductor wafer, comprising:
a semiconductor wafer including an edge support ring around a perimeter of the semiconductor wafer and a conductive layer formed over a surface of the semiconductor wafer; and
a first stencil including a plurality of first openings, wherein the first stencil is disposed over the edge support ring with the plurality of first openings extending below a top surface of the edge support ring to a flux material formed over the conductive layer.

15. The semiconductor wafer of claim 14, further including a plurality of bumps disposed over the first stencil to occupy the plurality of first openings over the conductive layer.

16. The semiconductor wafer of claim 14, wherein the first stencil includes a horizontal portion containing the plurality of first openings and a vertical extension disposed over the edge support ring and extending to the horizontal portion of the first stencil.

17. The semiconductor wafer of claim 14, wherein the first stencil includes a notch disposed over the edge support ring.

18. The semiconductor wafer of claim 14, wherein the first stencil includes a horizontal portion and a step-down portion extending from a top surface of the edge support ring to the horizontal portion of the first stencil.

* * * * *